(12) United States Patent
Yoo et al.

(10) Patent No.: US 7,732,105 B2
(45) Date of Patent: Jun. 8, 2010

(54) PHOTOMASK WITH OVERLAY MARK AND METHOD OF FABRICATING SEMICONDUCTOR DEVICE

(75) Inventors: Do-Yul Yoo, Gyeonggi-do (KR); Ji-Yong You, Gyeonggi-do (KR); Joong-Sung Kim, Gyeonggi-do (KR); Hyung-Joo Youn, Gyeonggi-do (KR)

(73) Assignee: Samsung Electronics Co., Ltd., Gyeonggie-Do (KR)

( * ) Notice: Subject to any disclaimer, the term of this patent is extended or adjusted under 35 U.S.C. 154(b) by 500 days.

(21) Appl. No.: 11/777,863

(22) Filed: Jul. 13, 2007

(65) Prior Publication Data

US 2008/0014511 A1    Jan. 17, 2008

(30) Foreign Application Priority Data

Jul. 13, 2006    (KR) ...................... 10-2006-0065990

(51) Int. Cl.
*G03F 1/00* (2006.01)
*G03F 9/00* (2006.01)

(52) U.S. Cl. ............................................ 430/5; 430/22
(58) Field of Classification Search .................. 430/5, 430/22, 394; 355/53, 72
See application file for complete search history.

(56) References Cited

U.S. PATENT DOCUMENTS 6,034,375 A    3/2000   Nozue
6,063,529 A *  5/2000   Hwang .......................... 430/22
6,636,312 B1* 10/2003  Hsin et al. .................. 356/401

FOREIGN PATENT DOCUMENTS

| JP | 10-289842 | 10/1998 |
|---|---|---|
| JP | 2000-235947 | 8/2000 |
| JP | 2003-234272 | 8/2003 |
| JP | 2005-317617 | 11/2005 |
| KR | 1997-0049098 | 7/1997 |
| KR | 1998-0081264 | 11/1998 |
| KR | 2001-0005118 | 1/2001 |

OTHER PUBLICATIONS

English language abstract of Japanese Publication No. 10-289842.
English language abstract of Korean Publication No. 1998-0081264.
English language abstract of Korean Publication No. 2001-0005118.
English language abstract of Japanese Publication No. 2005-317617.

* cited by examiner

*Primary Examiner*—Stephen Rosasco
(74) *Attorney, Agent, or Firm*—Myers Bigel Sibley & Sajovec, PA

(57) ABSTRACT

Provided are a photomask and a method of fabricating a semiconductor device. The photomask includes a photomask substrate including a chip region and a scribe lane region, with an overlay mark formed in the scribe lane region. The overlay mark includes one or more sub-overlay marks. Each of the sub-overlay marks includes a plurality of unit regions sequentially connected to each other and having different widths, where the width of a given unit region is constant.

28 Claims, 6 Drawing Sheets

PHOTOMASK WITH OVERLAY MARK AND METHOD OF FABRICATING SEMICONDUCTOR DEVICE

CROSS-REFERENCE TO RELATED APPLICATIONS

This U.S. non-provisional patent application claims priority under 35 U.S.C. §119 of Korean Patent Application No. 2006-65990, filed on Jul. 13, 2006, the entire contents of which are hereby incorporated by reference.

BACKGROUND OF THE INVENTION

The present invention disclosed herein relates to a photomask with an overlay mark and a method of fabricating a semiconductor using the photomask.

Semiconductor devices can be manufactured through deposition, ion implantation, photolithography, and etching steps. Theses steps may be repeated several tens to several hundreds of times to manufacture a semiconductor device. For example, a process of manufacturing a semiconductor device may include forming a device isolation pattern layer for isolating active regions from each other, forming gate patterns across the active regions, and forming plugs contacting the gate patterns. The device isolation pattern layer, the gate patterns, and the plugs may be respectively formed by deposition, photolithography, and etching steps.

Most modern semiconductor devices are constructed in three dimensions by stacking fine patterns of two-dimensional structures. Generally, fine patterns formed in the same process can be properly arranged in two dimensions since the fine patterns are formed using one photomask. If the fine patterns are formed by using different photomasks (e.g., gate patterns and plugs), however, proper alignment of the photomasks and the resulting layers is key to making a functioning three-dimensional structure.

In conventional practices, alignment marks or overlay marks formed in photomasks are used for the arrangement. It is difficult to properly arrange fine patterns at high accuracy of overlay using this method, however. The locations of alignment or overlay marks formed in the previous process are monitored during the photolithography processes. Conventional methods of measurement use the scattering or reflection characteristics of a light beam to measure whether the overlay patterns have been accurately placed. Such phenomena results from a difference between overlay marks and the surroundings.

One problem is that overlay marks formed together with a lower pattern may be deformed during the following processes such as etching, deposition, or chemical mechanical polishing (CMP). In this case, the overlay accuracy of the patterns cannot be precisely measured since the scattering or reflection characteristics of a light beam are affected by the deformation of the overlay marks.

An additional problem is that one alignment mark may not be proper for all purposes. It is known, for instance, that etching, deposition, and CMP processes affect the overlay accuracy of the patterns in different ways. For example, it is advantageous to use overlay marks with a smaller line width for a deposition or etching process. In contrast, it may be advantageous to use overlay marks with a larger line width for alignment during CMP processes.

In order to achieve a desired overlay accuracy, therefore, it is required that multiple overlay marks be formed with various line widths such that they can be used for monitoring various process conditions. That is, the number of overlay marks may be increased for obtain desired overlay accuracy. However, there is only a limited space available for such marks and increasing the number of overlay marks would result in a corresponding decrease in the areas used for testing and fabricating a chip, such as a test pattern and a chip region. That is, although overlay marks having various line widths are required to cope with various process conditions, the number of the overlay marks should be kept at a minimal level since the area of a wafer is limited.

Accordingly, the need remains for overlay marks of the type that improve accuracy of measurement under various process conditions while minimizing the area of the wafer dedicated to such overlay structures.

SUMMARY OF THE INVENTION

Embodiments of the present invention provide photomasks that include a chip region and a scribe lane region defined on the photomask substrate. An overlay mark is formed in the scribe lane region that includes one or more sub-overlay marks. Each of the sub-overlay marks includes a plurality of unit regions sequentially connected to each other and having different widths.

In some embodiments, the sub-overlay mark has a stepped shape. For this, the unit regions may be arranged from one end to the other end of the sub-overlay mark to allow the sub-overlay mark to increase in width step by step. Each of the unit regions of the sub-overlay mark may have a substantially rectangular shape with a width in a range of 0.1 µm to 100 µm, and a minimal difference between the widths of the unit regions may range from 0.1 µm to 1 µm.

In other embodiments, the overlay mark may have a closed-line shape with a plurality of sides, and at least one of the sides of the overlay mark may include the sub-overlay mark.

In still other embodiments, the overlay mark may include a plurality of branches running outward from a center point, and at least one of the branches may include the sub-overlay mark.

In even other embodiments, the sub-overlay marks of the overlay mark may be parallel to each other.

In other embodiments of the present invention, there are provided methods of fabricating a semiconductor device. One method includes forming a main overlay mark on a semiconductor substrate, and forming a vernier overlay mark on the semiconductor substrate close to the main overlay mark. The main overlay mark includes one or more sub-overlay marks, and each of the sub-overlay marks includes a plurality of unit regions sequentially connected to each other and having different widths. In a second method of fabricating a semiconductor device, overlay marks are formed on two adjacent layers of a semiconductor device where each of the sub-overlay marks including a plurality of unit regions sequentially connected to each other and having different widths. The overlay accuracy between the adjacent layers is measured using a selected one of the unit regions. If the overlay accuracy is measured to be greater than an allowable accuracy value, one of the layers is removed and then reformed.

In some embodiments, the forming of the main overlay mark includes forming the sub-overlay mark into a stepped shape by arranging the unit regions from one end to the other end of the sub-overlay mark to increase a width of the sub-overlay mark step by step. The forming of the main overlay mark includes forming the unit regions of the sub-overlay mark into a substantially rectangular shape.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the specification, the dimensions of layers and regions are exaggerated for clarity of illustration. It will also be understood that when a layer (or film) is referred to as being 'on' another layer or substrate, it can be directly on the other layer or substrate, or intervening layers may also be present. Also, though terms like a first, a second, and a third are used to describe various regions and layers in various embodiments of the present invention, the regions and the layers are not limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

Figure 1:
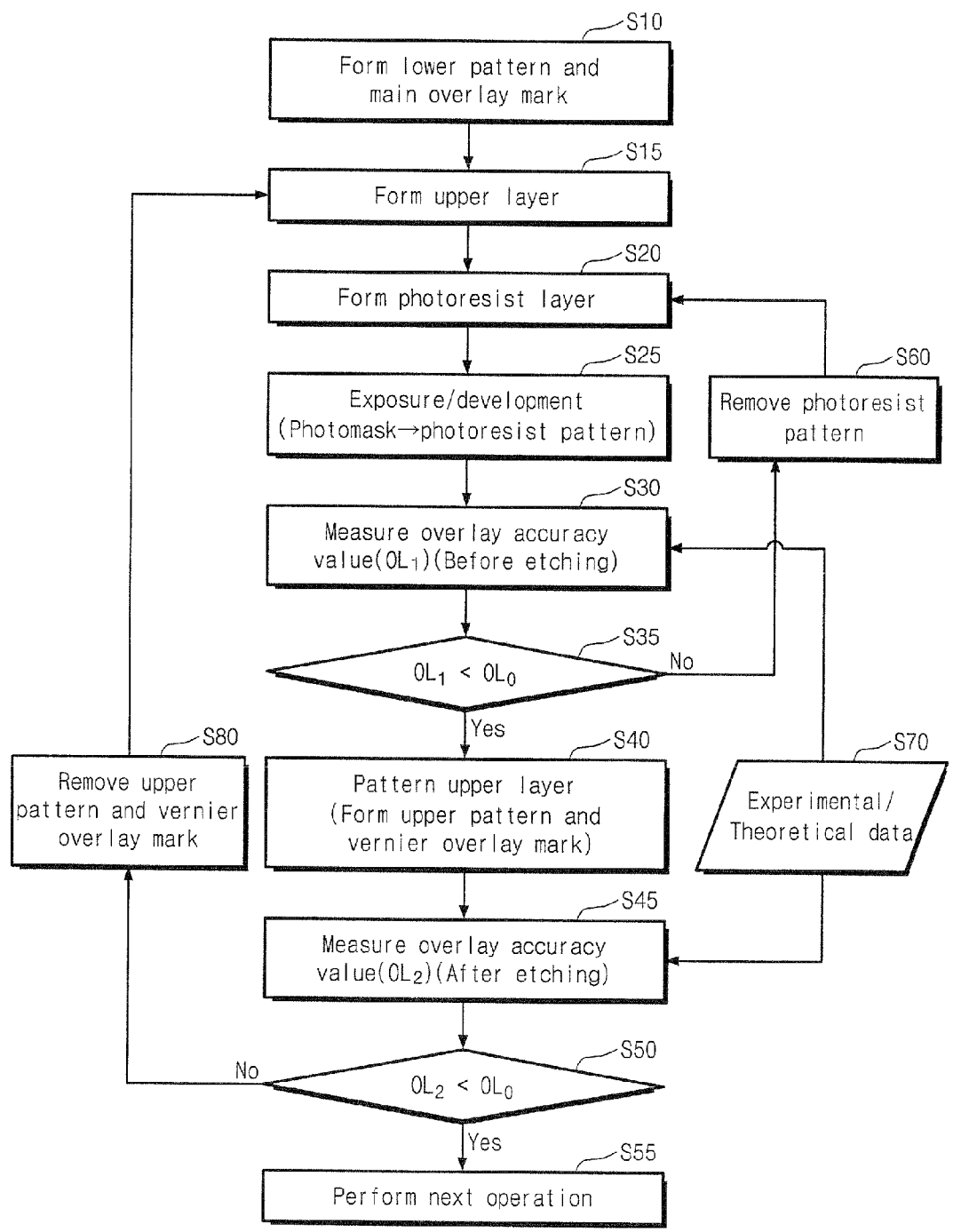
FIG. 1 is a flowchart for explaining a method of fabricating a semiconductor device according to an embodiment of the present invention.

FIG. 1 is a flowchart for explaining a method of fabricating a semiconductor device according to an embodiment of the present invention.

Referring to FIG. 1, in operation S10, a lower pattern and a main overlay mark are formed on a semiconductor substrate. In operation S15, an upper layer is formed on the resulting structure of operation S10. In operation S20, a photoresist layer is formed on the upper layer. In operation S25, the photoresist layer is patterned by photolithography using a photomask to form a photoresist pattern. In operation S40, the upper layer is patterned using the photoresist pattern as an etch mask to form an upper pattern and a vernier overlay mark on the lower pattern and the main overlay mark. For example, the lower pattern may be a gate pattern, and the upper layer may be an interlayer insulation layer covering the gate pattern. The patterning of the upper layer may be performed by etching the upper layer to form contact holes through the upper layer.

In the current embodiment of the present invention, the photomask includes prototype patterns for forming a semiconductor device, and the photoresist pattern, the upper pattern, and the vernier overlay mark are formed using the prototype patterns by photolithography or patterning. Here, the photoresist pattern includes a photoresist overlay pattern defining the vernier overlay mark.

In the current embodiment of the present invention, an overlay accuracy between the photoresist pattern and the lower pattern is measured by comparing the positions of the photoresist overlay pattern and the main overlay mark in operation S30. As described above, the overlay accuracy is measured based on a region having a proper line width in consideration of various process conditions. The photomask of the current embodiment includes an overlay pattern, and the overlay pattern includes regions that have different widths and are sequentially connected to one another. Therefore, the photomask is not required to have excessively many overlay patterns, and thus the problem with the related art does not occur in the current embodiment of the present invention. The photomask of the present invention will be described later in more detail with reference to FIGS. 3 through 10. The vernier overlay mark and the photoresist overlay pattern have the same shape-related characteristics as the overlay mark of the photomask that will be described with reference to FIGS. 3 through 10. When an overlay accuracy is measured, a region having a proper line width may be selected based on experience or theory in operation S70.

In operation S35, it is determined whether a measured overlay accuracy value $OL_1$ before etching is less than an allowable accuracy value $OL_0$. If the measured overlay value $OL_1$ before etching is not less than the allowable accuracy value $OL_0$, the photoresist pattern is removed in operation S60. Then, a re-work operation is performed to form a photoresist pattern again. On the other hand, if the measure overlay value $OL_1$ before etching is less than the allowable accuracy value $OL_0$, the upper layer is patterned in operation S40 as described above.

In operation S45, the position of the vernier overlay mark formed in operation S40 is compared with the position of the main overlay mark to measure an overlay accuracy value $OL_2$ between the lower pattern and the upper pattern formed in operation S40. Like in operation S30 where the overlay accuracy $OL_1$ is measured, a region having a proper line width is selected based on experience or theory for precise measurement in operation S70. In the current embodiment of the present invention, since the main overlay mark or the vernier overlay mark includes regions having various line widths, a desired line width may be easily selected from the line widths of the regions of the main overlay mark or the vernier overlay mark (this will be described later in more detail with reference to FIGS. 3 through 10). In operation S50, it is determined whether the measured overlay accuracy value $OL_2$ after etching is less than the allowable accuracy value $OL_0$. If the measured overlay accuracy value $OL_2$ after etching is not less than the allowable accuracy value $OL_0$, a re-work operation is performed in operation S80 to remove the upper pattern and the vernier overlay mark, and the procedure goes back to operation S15 to form an upper layer again. On the contrary, if the measured overlay accuracy value $OL_2$ after etching is less than the allowable accuracy value $OL_0$, the procedure goes to the next operation S55.

Meanwhile, the lower pattern and the main overlay mark are formed by patterning using the same photomask as that used for forming the photoresist pattern in operation S25. Thus, the main overlay mark has the same shape-related characteristics as the overlay mark of the photomask that will be described with reference to FIGS. 3 through 10. Furthermore, the vernier overlay mark may be used to measure overlay accuracy in the following process. Alternatively, another vernier overlay mark may be formed together with the vernier overlay mark for the same purpose.

Figure 2:
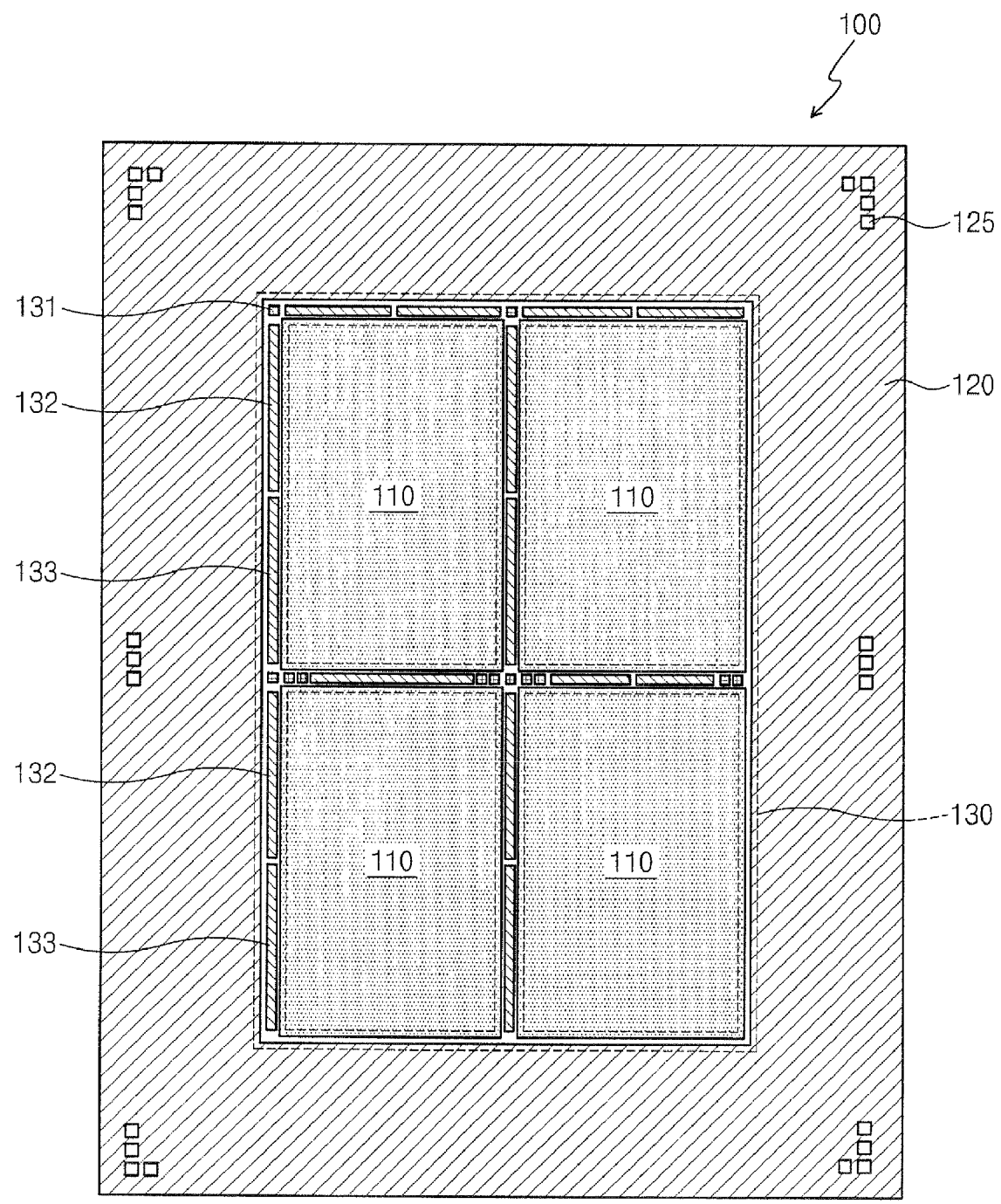
FIG. 2 is a plan view illustrating a photomask according to an embodiment of the present invention.

FIG. 2 is a plan view illustrating a photomask 100 according to an embodiment of the present invention.

Referring to FIG. 2, the photomask 100 may include chip regions 110, a shading region 120, and a scribe lane region 130.

The chip regions 110 and the scribe lane region 130 are regions where prototype patterns are formed. Patterns corresponding to the prototype patterns will be formed in a wafer through an exposure process (that is, the prototype patterns will be transferred to a wafer through an exposure process). Prototype patterns for semiconductor chips are formed in the chip regions 110. The photomask 100 may includes a plurality of chip regions as shown in FIG. 2 so as to increase the efficiency of a photolithography process.

In a final sawing process, the chip regions 110 are separated based on the scribe lane region 130. For this, the scribe lane region 130 is formed among the chip regions 110 and the shading region 120. The scribe lane region 130 may include at least one overlay mark 131, at least one test pattern region 132, and at least one monitoring pattern region 133. As explained above, the overlay mark 131 is used to measure an overlay accuracy between lower and upper patterns that are formed using different photomasks. In the test pattern region 132, test patterns may be disposed for indirectly evaluating electrical characteristics of a semiconductor chip. In the monitoring pattern region 133, monitoring patterns may be disposed to monitor a semiconductor manufacturing process.

The shading region 120 is formed around the chip regions 110 and the scribe lane region 130 for blocking light during an exposure process. In the current embodiment of the present invention, at least on alignment mark 125 is formed in the shading region 120. The alignment mark 125 may be used to align the photomask 100 with an exposing stage or a wafer (formed with a lower pattern). In another embodiment of the present invention, the alignment mark 125 may be formed in the scribe lane region 130.

In the following description, exemplary structures of the overlay mark 131 will be illustrated with reference to FIGS. 3 through 10 according to embodiments of the present invention. In an embodiment of the present invention, the alignment mark 125 may have the same shape as the overlay mark 131 (although the alignment mark 125 may be different in size from the overlay mark 131). Therefore, description of the alignment mark 125 will be omitted for clarity.

FIGS. 3 through 10 are plan views illustrating exemplary structure of the overlay mark 131 according to embodiments of the present invention. The overlay mark 131 includes at least one sub-overlay mark 200.

Figure 3:
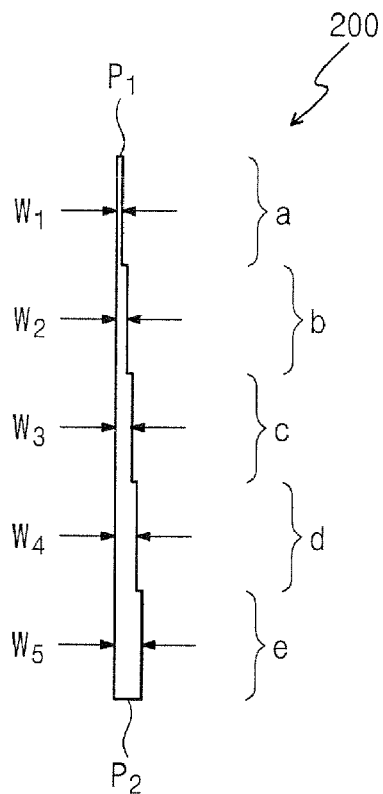
FIGS. 3 through 10 are plan views illustrating overlay marks according to embodiments of the present invention.
Figure 4:
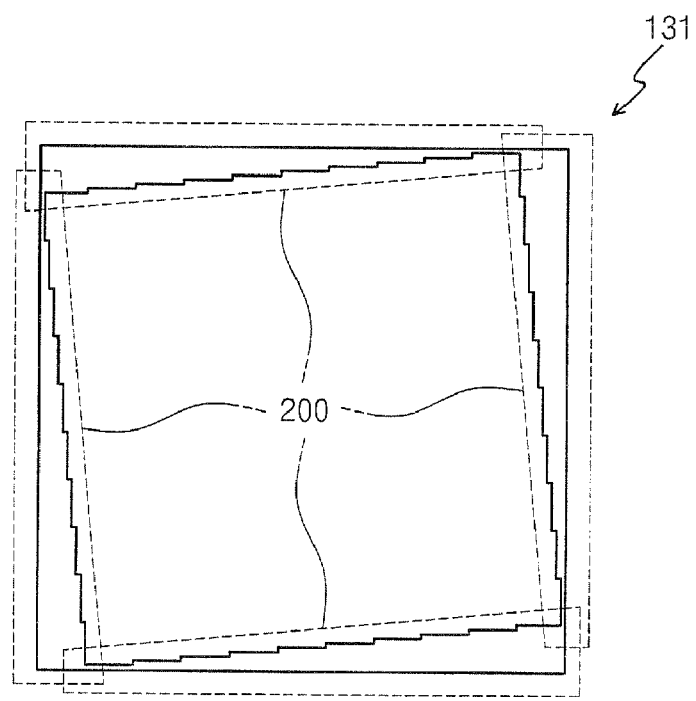

Referring to FIG. 3, the sub-overlay mark 200 includes a plurality of unit regions a, b, c, d, and e that are sequentially connected to one another and have different widths $W_1$, $W_2$, $W_3$, $W_4$, and $W_5$. Although the sub-overlay mark 200 includes five unit regions in the embodiment shown in FIG. 3, the number and arrangement of the unit regions of the sub-overlay mark 200 may be changed.

In the current embodiment, the sub-overlay mark 200 has a stepped shape, and the unit regions a, b, c, d, and e of the sub-overlay mark 200 increase in width as it goes from one end $P_1$ to the other end $P_2$ ($|W_{i+1}-W_i|>0$). Approximately, each of the unit regions a, b, c, d, and e has a rectangular shape. That is, although the unit regions a, b, c, d, and e are different in width, the width of a given unit region is constant. Owing to this local constancy of width, overlay accuracy may be easily measured. In other words, when the width of the sub-overlay mark 200 varies linearly, it may be difficult to select a portion of the sub-overlay mark 200 having a desired width. However, in the current embodiment of the present invention, the width of the sub-overlay mark 200 varies in a step-by-step manner, such that a portion of the sub-overlay mark 200 having a desired width can be easily selected. For example, a desired width may be selected from the unit regions a, b, c, d, and e by counting the order of the unit regions a, b, c, d, and e.

Each of the widths $W_1$, $W_2$, $W_3$, $W_4$, and $W_5$ of the unit regions a, b, c, d, and e of the sub-overlay mark 200 may range from 0.1 μm to 100 μm, and a width difference ($W_{i+1}-W_i$) may range from 0.1μ to 1 μm. In a well-known scale-down exposure method, a photoresist pattern formed on a wafer may be smaller than a prototype pattern of a photomask. That is, the size of an overlay mark formed on a wafer may be determined by the product of the size of the sub-overlay mark 200 and the magnification of an exposure apparatus. In an embodiment of the present invention, the sub-overlay mark 200 may include ten unit regions each having a width in the range from 0.3 μm to 3 μm. In this case, a width difference of the unit regions may be 0.3 μm (i.e., $W_{i+1}-W_i=0.3$ μm where i=1, 2, through to 10).

FIGS. 4 through 10 are plan views illustrating exemplary structures of the overlay mark 131 according to embodiments of the present invention.

In the present invention, the overlay mark 131 may have a closed-line shape with a plurality of sides. Here, at least one of the sides of the overlay mark 131 includes a sub-overlay mark 200 like that illustrated in FIG. 3. For example, referring to FIG. 4, the overlay mark 131 may have a rectangular closed-line shape with four sub-overlay marks 200.

Figure 5:
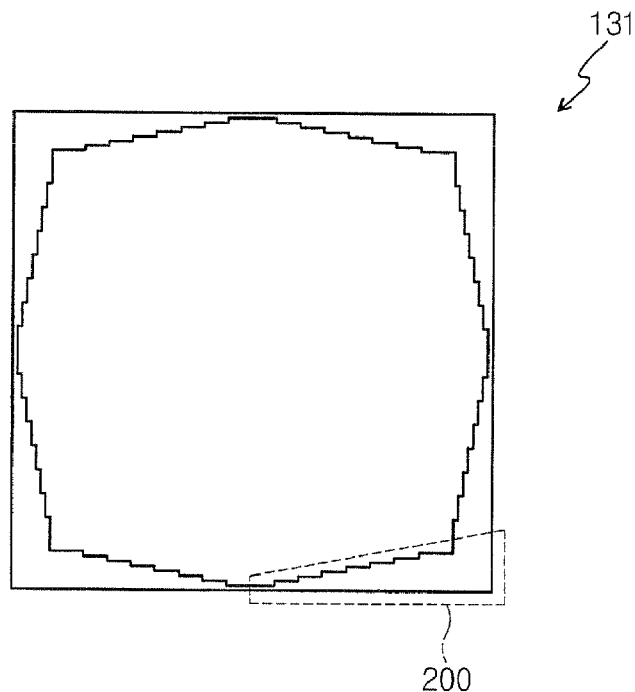
Figure 6:
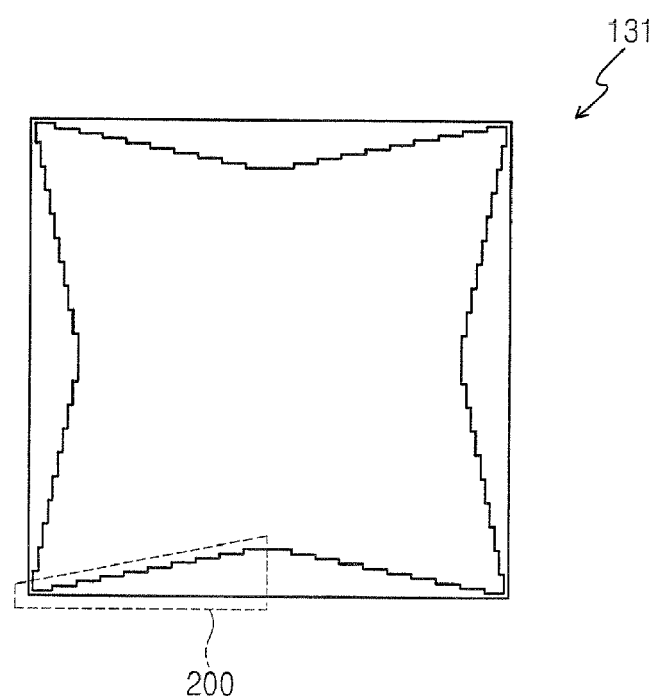

In other embodiments of the present invention, the overlay mark 131 may have a rectangular close-line shape with eight sub-overlay marks 200 as shown in FIGS. 5 and 6. In detail, referring to FIG. 5, the sub-overlay marks 200 of the overlay mark 131 are connected in a manner such that the thickest unit regions of the sub-overlay marks 200 may be connected to one another at corners of the overlay mark 131. Alternatively, referring to FIG. 6, the thinnest unit regions of the sub-overlay marks 200 may be connected to one another at corners of the overlay mark 131.

Figure 7:
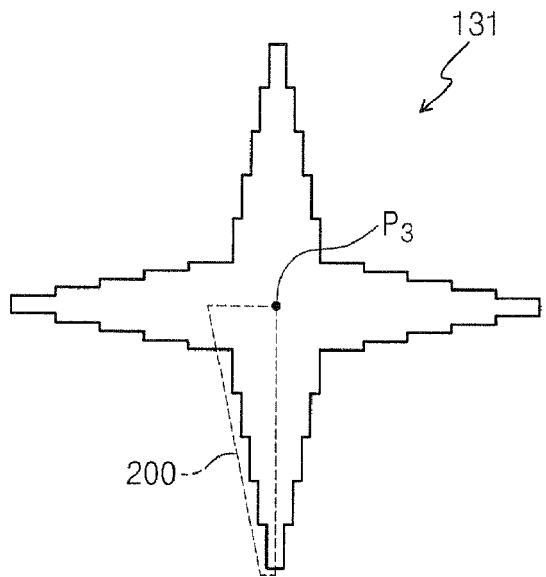
Figure 8:
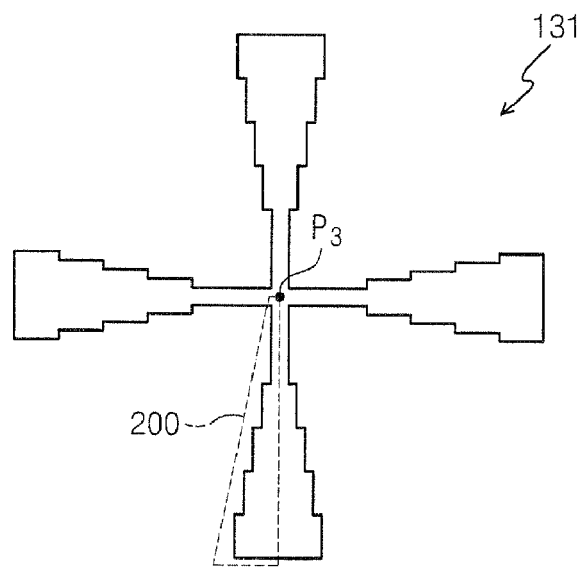

In other embodiments of the present invention, the overlay mark 131 may include branches running outward from a center point $P_3$. For example, the overlay mark 131 may include four branches running outward from the center point $P_3$. In this case, as shown in FIGS. 7 and 8, the overlay mark 131 may be shaped like a cross. Each of the branches of the overlay mark 131 may be formed by two sub-overlay marks 200 (refer to FIG. 3). In detail, referring to FIG. 7, the thickest unit regions of the sub-overlay marks 200 may be connected to one another at the center point $P_3$ of the overlay mark 131. Alternatively, referring to FIG. 8, the thinnest unit regions of the sub-overlay marks 200 may be connected to one another at the center point $P_3$ of the overlay mark 131.

Figure 9:
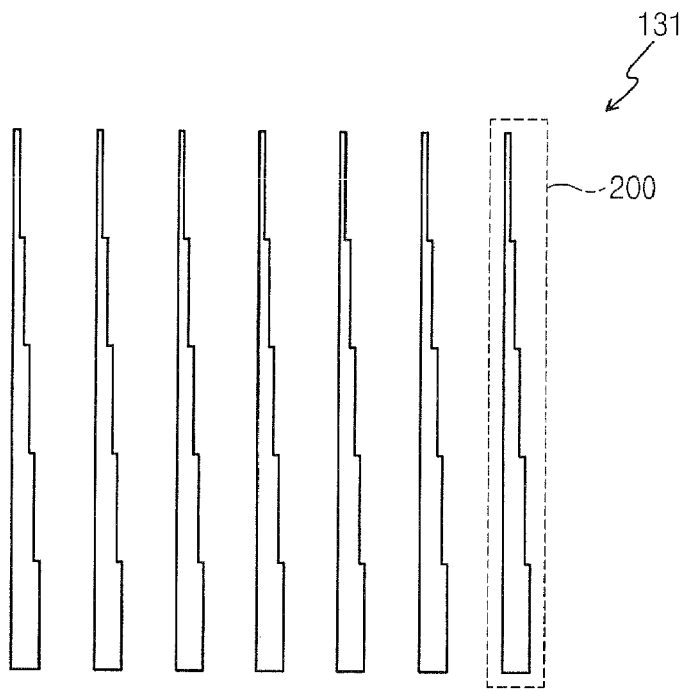
Figure 10:
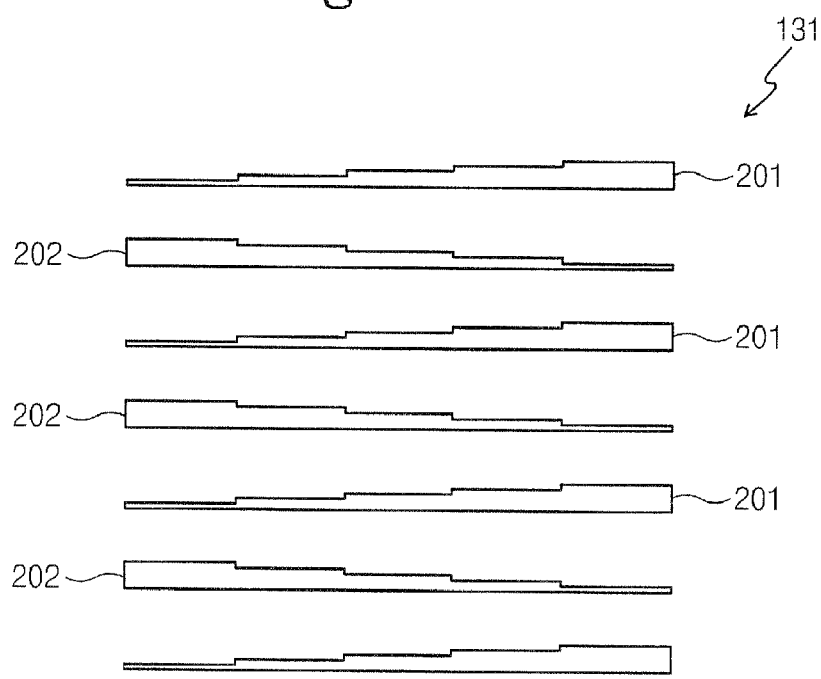

In other embodiments of the present invention, the overlay mark 131 may include a plurality of parallel sub-overlay marks as shown in FIGS. 9 and 10. In detail, referring to FIG. 9, the overlay mark 131 may include a plurality of sub-overlay marks 200 that are parallel to one another and aligned in the same direction. Alternatively, referring to FIG. 10, the overlay mark 131 may include a first group of parallel sub-overlay marks 201 and a second group of sub-overlay marks 202. Although the sub-overlay marks 201 are parallel with the sub-overlay marks 202, the sub-overlay marks 201 and 202 are aligned in opposite directions.

As described above, according to the present invention, the overlay mark of the photomask includes at least one sub-overlay mask, and the sub-overlay mask includes a plurality of unit regions having different widths. Therefore, when the photomask of the present invention is used in a process of manufacturing a semiconductor device, overlay accuracy may be easily measured in spite of various process conditions without increasing the number of overlay marks.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A photomask comprising:
   a photomask substrate including a chip region and a scribe lane region; and
   an overlay mark formed in the scribe lane region,
   wherein the overlay mark includes one or more sub-overlay marks, and each of the sub-overlay marks includes a plurality of unit regions sequentially connected to each other and having different widths.

2. The photomask of claim 1, wherein the unit regions have stepwise increasing widths between both endpoints of the sub-overlay mark such that the sub-overlay mark has a stepped shape.

3. The photomask of claim 2, wherein each of the unit regions of the sub-overlay mark has a substantially rectangular shape with a width in a range of 0.1 µm to 100 µm, and a minimum difference between the widths of the unit regions ranging from 0.1 µm to 1 µm.

4. The photomask of claim 2, wherein the overlay mark has a closed-line shape with a plurality of sides, and at least one of the sides of the overlay mark includes the sub-overlay mark.

5. The photomask of claim 2, wherein the overlay mark has a rectangular closed-line shape with four sides, and at least one of the four sides of the overlay mark includes the sub-overlay mark.

6. The photomask of claim 5, wherein each of the four sides of the rectangular overlay mark includes a respective one of the one or more sub-overlay marks.

7. The photomask of claim 5, wherein the sub-overlay mark includes ten unit regions each having a width in a range of approximately 0.3 µm to 3 µm, and a width difference between adjacent unit regions of approximately 0.3 µm.

8. The photomask of claim 5, wherein each of the four sides of the overlay mark includes two connected sub-overlay marks.

9. The photomask of claim 8, wherein a thickest unit region of each of the sub-overlay marks is formed at a corner of the rectangular overlay mark.

10. The photomask of claim 8, wherein a thinnest unit region of each of the sub-overlay marks is formed at a corner of the rectangular overlay mark.

11. The photomask of claim 2, wherein the overlay mark includes a plurality of branches running outward from a center point, and at least one of the branches includes the sub-overlay mark.

12. The photomask of claim 2, wherein the overlay mark includes four branches running outward from the center point, wherein each of the four branches of the overlay mark includes a respective one of the one or more sub-overlay marks.

13. The photomask of claim 12, wherein each branch includes a sub-overlay mark formed on opposing sides of the branch so that a thickest unit region of the overlay marks are connected to one another at the center point of the overlay mark.

14. The photomask of claim 12, wherein each branch includes a sub-overlay mark formed on opposing sides of the branch so that a thinnest unit region of the overlay marks are connected to one another at the center point of the overlay mark.

15. The photomask of claim 1, wherein the sub-overlay marks of the overlay mark are parallel to each other.

16. The photomask of claim 14, wherein the sub-overlay marks of the overlay mark are aligned in the same direction.

17. The photomask of claim 14, wherein the overlay mark includes a first group of sub-overlay marks and a second group of sub-overlay marks, with the first group being parallel with the second group but aligned in an opposite direction.

18. A method of fabricating a semiconductor device, comprising:
   preparing a semiconductor substrate; and
   forming a main overlay mark having one or more sub-overlay marks on the semiconductor substrate, with each of the sub-overlay marks including a plurality of unit regions sequentially connected to each other and having different widths.

19. The method of claim 17, wherein the forming of the main overlay mark comprises forming the unit regions between both endpoints of the sub-overlay mark to have stepwise increasing widths.

20. The method of claim 17, wherein the forming of the main overlay mark comprises forming the unit regions of the sub-overlay mark into a substantially rectangular shape,
   wherein each of the unit regions has a width in a range from 0.1 µm to 100 µm, and a minimum difference between the widths of adjacent unit regions ranges from 0.1 µm to 1 µm.

21. The method of claim 17, wherein the main overlay mark is formed into a closed-line shape with a plurality of sides, and at least one of the sides of the main overlay mark includes the sub-overlay mark.

22. The method of claim 17, wherein the main overlay mark is formed into a rectangular closed-line shape with four sides, and each of the four sides of the main overlay mark includes one of the one or more sub-overlay marks.

23. The method of claim 17, further including forming a vernier overlay mark on the semiconductor substrate close to the main overlay mark, wherein the vernier overlay mark comprises at least one vernier sub-overlay mark including a plurality of unit regions having different widths, where the width of a given unit region is constant.

24. The method of claim 22, wherein the vernier overlay mark includes a plurality of branches running outward from a center point, and at least one of the branches includes the vernier sub-overlay mark.

25. The method of claim 17, wherein the overlay mark includes a plurality of sub-overlay marks formed in parallel to each other.

26. A method of fabricating a semiconductor device, comprising:
   forming overlay marks on two adjacent layers of a semiconductor device, each of the sub-overlay marks including a plurality of unit regions sequentially connected to each other and having different widths;
   measuring an overlay accuracy value between the adjacent layers using a selected one of the unit regions; and
   removing one of the layers if the overlay accuracy value is greater than an allowable accuracy value.

27. The method of claim 25, wherein the selected one of the unit regions is a first unit region for a first type of process, and a second unit region for a second type of process, wherein the width of the second unit region is greater than the width for the first unit region.

28. The method of claim 26, wherein the first type of process is a deposition or etching process, and the second type of process is a CMP process.

* * * * *